United States Patent [19]
Han

[11] Patent Number: 5,817,575
[45] Date of Patent: Oct. 6, 1998

[54] PREVENTION OF CLOGGING IN CVD APPARATUS

[75] Inventor: Leon M. Han, San Jose, Calif.

[73] Assignee: Advanced Micro Devices, Inc., Sunnyvale, Calif.

[21] Appl. No.: 594,058

[22] Filed: Jan. 30, 1996

[51] Int. Cl.⁶ .................................................. H01L 21/44
[52] U.S. Cl. ........................ 438/680; 438/683; 427/555; 118/715
[58] Field of Search ..................................... 437/190, 192, 437/228; 156/345; 118/715, 900; 427/448.1, 555; 438/680, 683

[56] References Cited

U.S. PATENT DOCUMENTS

| | | | |
|---|---|---|---|
| 3,901,182 | 8/1975 | Chiang | 118/49 |
| 4,657,616 | 4/1987 | Benzing et al. | 156/345 |
| 5,326,723 | 7/1994 | Petro et al. | 437/192 |
| 5,647,945 | 7/1997 | Matsuse et al. | 156/345 |

*Primary Examiner*—Charles L. Bowers, Jr.
*Assistant Examiner*—Reneé R. Berry

[57] ABSTRACT

Plugging of the effluent line of an apparatus comprising CVD chamber is prevented or substantially reduced by injecting a hot gas into the effluent line during processing. In CVD tungsten processing, including preconditioning the reaction chamber, deposition, and cleaning, a hot gas, such as dried air or nitrogen, is injected into the effluent line downstream of the vacuum pump to maintain the temperature of the internal walls of the effluent line below that at which condensation of $WOF_4$ occurs. In another embodiment, periodic high bursts of a hot gas into the effluent line removes $WO_3$ deposits proximate the inlet of the downstream wet scrubber.

43 Claims, 3 Drawing Sheets

PREVENTION OF CLOGGING IN CVD APPARATUS

TECHNICAL FIELD

The present invention relates to an apparatus comprising a chemical vapor deposition (CVD) chamber having an effluent line in communication with a scrubber, and to a method of reducing clogging in the effluent line and scrubber. The invention has particularly applicability to a method of manufacturing a semiconductor device employing tungsten (W)-CVD.

BACKGROUND ART

Conventional methods for manufacturing semiconductor devices comprise numerous processing steps, many of which involve the deposition of a metal by CVD and subsequently etching portions of the deposited metal to form a conductive pattern and/or interconnection. Typically, such CVD is conducted in an apparatus comprising a CVD chamber. A conventional processing sequence comprises preconditioning the chamber by introducing the metallic species to be deposited prior to actual deposition, CVD, and cleaning the chamber. During such processing, vapors are continuously removed from the CVD chamber by a vacuum pump through an effluent line. The effluent vapors, which include reaction products, are usually environmentally harmful. Accordingly, conventional practices also comprise employing a scrubber, such as a dry or wet scrubber, in communication with the effluent line for treatment of vapors removed from the chamber.

Severe clogging problems usually occur in such conventional CVD systems. One type of acute clogging problem occurs in the effluent line due to condensation of vapors resulting in the deposition of particulate material. Another clogging problem occurs proximate the inlet of a wet scrubber in the moisture-rich area, usually just above the water tip-over insert. For example, W is typically deposited during various phases of manufacturing a semiconductor device by CVD employing tungsten hexafluoride ($WF_6$). A conventional apparatus employed for CVD comprises a CVD chamber in which preconditioning, CVD, and chamber cleaning are conducted. Chamber cleaning typically comprises removing tungsten as well as any reaction products from the internal walls of the chamber, and is conventionally conducted utilizing a fluorinated species such as $SF_6/O_2$, $NF_3/O_2$, $CF_4/O_2$, $C_2F_6$ or $NF_3$. Vapors are removed from the CVD chamber by a vacuum pump through an effluent line in communication with a downstream wet scrubber. Clogging of the effluent line and clogging in proximity to the inlet of the wet scrubber have become serious problems which result in equipment downtime, product uniformity, and exposure to toxic wastes.

A conventional apparatus utilized in the manufacture of semiconductor devices for CVD is schematically illustrated in FIG. 1 and comprises a CVD chamber 10. Process generated vapors are removed from chamber 10 by vacuum pump 11 through effluent line 12. As shown by the path of arrows, the vapors removed from chamber 10 are passed via effluent line 12 to scrubber 14. When employing a dry scrubber, a filter 13 shown in FIG. 1, is conventionally employed to remove particulate material. When employing a wet scrubber, the depicted filter 13 is omitted. The effluent from the scrubber is exhausted through vent 15. Severe clogging usually occurs in effluent line 12, particularly at elbows, such as at 90° elbow 16. In addition, clogging usually occurs near the inlet of a wet scrubber in the moisture-rich area.

A conventional wet scrubber, i.e., Vector ES-Series Fume Scrubber 20 marketed by ATMI ECOSYS Corp., of Santa Clara, Calif., is schematically illustrated in FIG. 2. The relevant portions of the depicted wet scrubber comprise water inlet 21, tip-over insert 22, lower O-ring seal of the throat 23, nitrogen ports 24, upper O-ring seal of the throat 25, lower band clamp 26, upper and lower spoolpiece O-rings 27 and upper band clamp 28. Clogging usually occurs approximate the tip-over insert as at 29.

When depositing W by CVD in a conventional apparatus comprising a CVD chamber, particulate deposition and consequential clogging of effluent line 12 (FIG. 1), such as at elbow 16, is usually due to condensation of tungsten hexafluoride $WOF_4$, believed to be a by-product generated primarily during the chamber cleaning phase of a typical W-CVD process. $WOF_4$ is a white crystalline solid with a melting point of 100° C. and a boiling point of 185° C. The vapor pressure of the solid is about 1 Torr at 56° C.; and about 20 Torr at 100° C. Due to its extremely low vapor pressure, $WOF_4$ condenses out as a solid as the temperature decreases along the effluent line. Thus, in practice, effluent line 12 has been found coated with white dry $WOF_4$ powder all the way from the pump outlet port to the inlet of the wet scrubber, resulting in severe clogging problems, particularly at elbows. It has been observed that as much as 95% of the particulate clogging problem is attributable to $WOF_4$ powder.

In a conventional wet scrubber just above the water tip-over pipe, there is a moisture-rich area which creates a different clogging problem than that caused by condensation of $WOF_4$ along effluent line 12. In the moisture-rich area of the wet scrubber, clogging occurs due to $WO_3$ solids. It is believed that such $WO_3$ solids result during chamber pre-coating and deposition steps, when a significant amount of unreacted gaseous $WF_6$ is released into the effluent line. $WF_6$ hydrolyzes in the presence of moisture to generate $WO_3$ solids which are deposited in the moisture-rich area of the wet scrubber. In addition, during chamber cleaning, gaseous $WOF_4$ in the exhaust system is usually hydrolyzed to form $WO_3$ solids.

Prior attempts to address particulate clogging in an apparatus comprising a W-CVD chamber involve wrapping a heating blanket or electrical heating tape around the effluent line to maintain the exhaust stream at an elevated temperature above the condensation temperature of $WOF_4$. This approach has not proved particularly affective, and frequent, time consuming, exhaust line cleaning is still required.

A prior attempt to address $WO_3$ clogging in a wet scrubber of an apparatus comprising a W-CVD chamber involves spraying water to dissolve deposited $WO_3$. This solution has also not been found particularly effective and is quite cumbersome.

Accordingly, there exists a need to prevent or substantially reduce clogging in an apparatus comprising a CVD chamber, particularly deposited $WOF_4$ in the effluent line of an apparatus for W deposition by CVD. There also exists a need for a simplified, cost-effective manner to reduce and/or remove deposited particulate material in a wet scrubber downstream of and in communication with the effluent line, particularly deposited $WO_3$.

DISCLOSURE OF THE INVENTION

An object of the present invention is an apparatus comprising a CVD chamber, which apparatus is substantially free of clogging in the chamber effluent line and downstream scrubber.

Another object of the present invention is a method of preventing or substantially reducing clogging in the effluent line of a CVD apparatus due to vapor condensation.

A further object of the present invention is a method of preventing or substantially reducing clogging in the effluent line of a W-CVD apparatus by preventing condensation of $WOF_4$.

Another object of the present invention is a method of preventing or substantially reducing clogging caused by $WO_3$ in a wet scrubber downstream of and in communication with the effluent line of a W-CVD chamber.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by an apparatus comprising: a chemical vapor deposition chamber; a vacuum pump having an inlet port and an outlet port, with the inlet port in communication with the chemical vapor deposition chamber; an effluent line in communication with the outlet port of the vacuum pump; a hot gas inlet line into the effluent line in proximity to the outlet port of the vacuum pump; a gas heater in communication with the hot gas inlet line; and a source of gas in communication with the gas heater.

Another aspect of the present invention is a method of reducing clogging in an apparatus comprising a chemical vapor deposition chamber due to condensation of vapors, which method comprises injecting a hot gas into the apparatus to maintain the temperature of internal walls of the apparatus above the temperature at which condensation of the vapors occurs.

A further aspect of the present invention is a method of reducing clogging in an apparatus comprising a chemical vapor deposition chamber due to condensation of vapors, wherein the apparatus comprises a vacuum pump having an inlet port in communication with the chemical vapor deposition chamber and an outlet port in communication with an effluent line, which method comprises injecting a hot gas into the effluent line downstream of and in proximity to the outlet port of the vacuum pump under conditions sufficient to prevent condensation of the vapors on the internal walls of the effluent line.

Another aspect of the present invention is a method of manufacturing a semiconductor device, which method comprises: depositing tungsten by chemical vapor deposition on a substrate in a chemical vapor deposition chamber; exhausting vapors from the chamber by a vacuum pump through an effluent line; and injecting a hot gas into the effluent line to substantially reduce clogging in the effluent line due to the condensation of $WOF_4$ by maintaining the internal walls of the effluent line at a temperature above that at which condensation of $WOF_4$ occurs.

A further object of the present invention is a method of reducing tungsten oxide clogging in the moisture-rich area of a wet scrubber situated downstream of and in communication with a tungsten-chemical vapor deposition chamber via an effluent line, which method comprises periodically injecting a hot gas into the effluent line at a rate of about 250 to about 350 slpm for about 5 to about 30 seconds.

Additional objects and advantages of the present invention will become readily apparent to those having ordinary skill in this art from which the following detailed description, wherein only certain embodiments of the invention is shown and described, simply by way of illustration of the best mode contemplated for carrying out the invention. As will be realized, the invention is capable of other and different embodiments, and its several details are capable of modifications in various respects, all without departing from the invention. Accordingly, the drawings and description are to be regarded as illustrative in nature, and not as restrictive.

DESCRIPTION OF THE INVENTION

Figure 1:
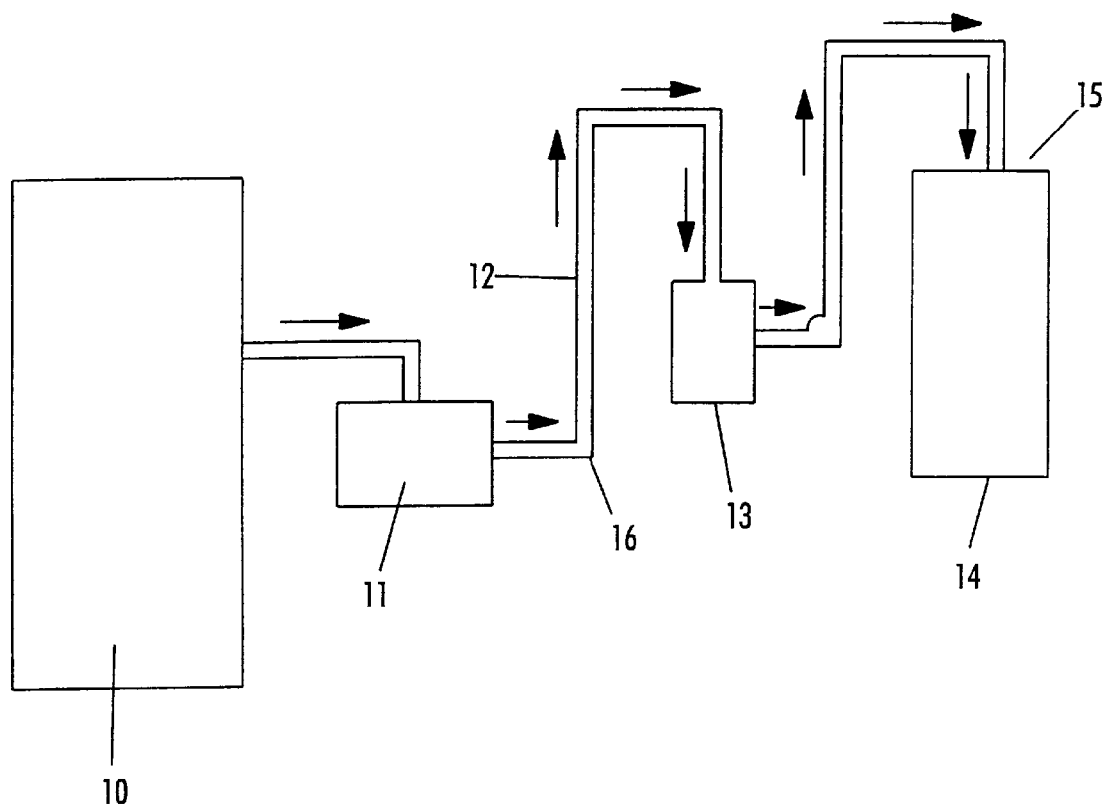
FIG. 1 schematically depicts a conventional CVD system.
Figure 2:
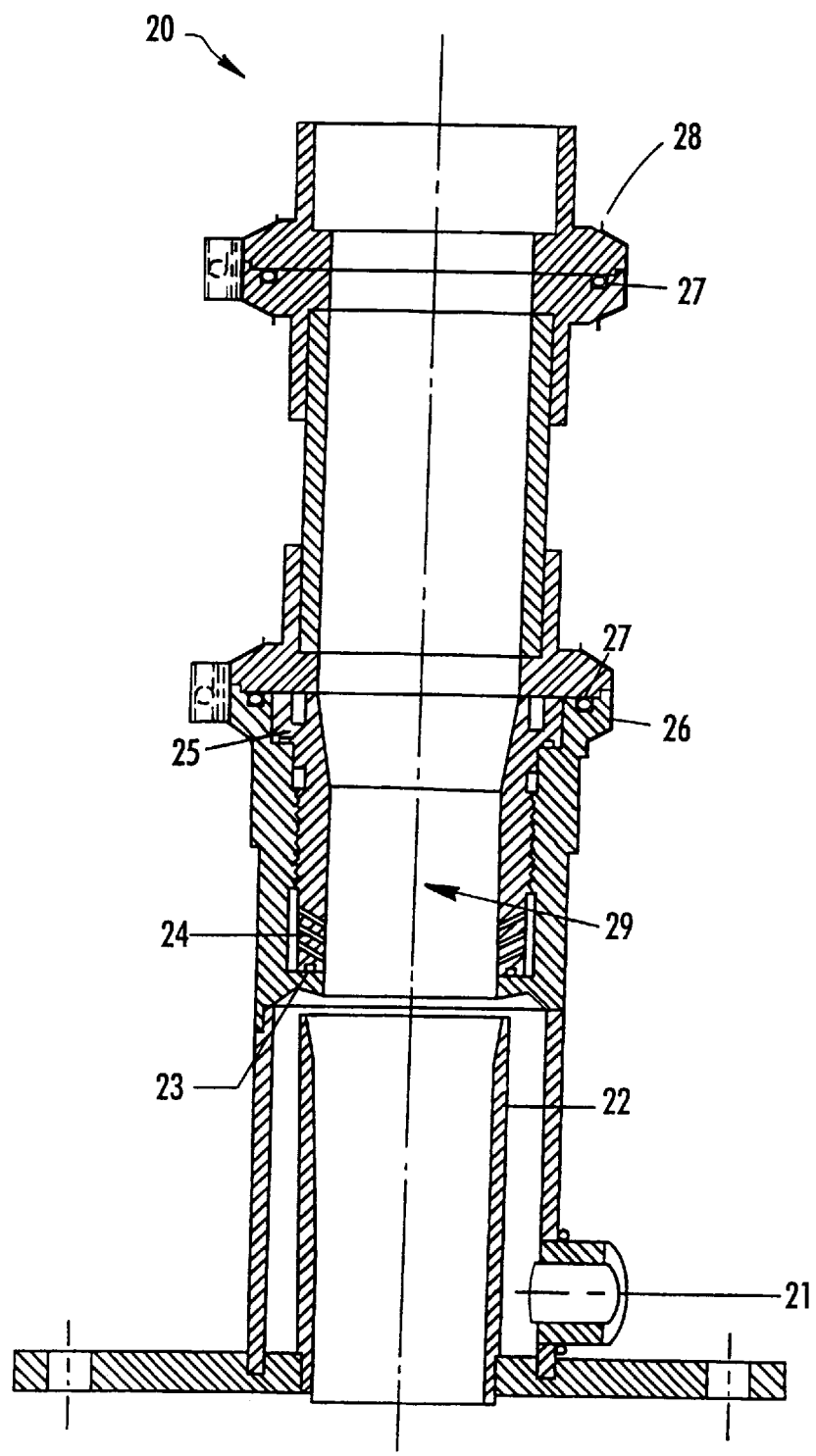
FIG. 2 schematically depicts a portion of a conventional wet scrubber.

The present invention addresses and solves the effluent line clogging problem occurring during metal deposition phases of conventional semiconductor manufacturing methods, as in forming an interconnection pattern. As shown in FIG. 1, particulate deposition and, hence, clogging occurs in effluent line 12, particularly at elbows, such as at 90° elbow 16. Conventional approaches to this particular problem comprise the application of an external electrical heating tape. This attempted solution to the effluent line clogging problem has been less than successful. It is believed that the length, configuration and heat transfer characteristics of conventional effluent lines render it difficult to address the effluent line clogging problem with an external electrical tape.

In accordance with the present invention, effluent line clogging in an apparatus comprising a CVD chamber is prevented or, at least, substantially reduced by the strategic injection of a hot gas into the effluent line downstream of and in proximity to the outlet port of the vacuum pump used to exhaust vapors from the chamber, such as vacuum pump 11 (FIG. 3), as at location 34. Thus, in accordance with the present invention, an apparatus is provided comprising a CVD chamber and a vacuum pump having an inlet port in communication with the chamber and an outlet port in communication with the an effluent line, as in a conventional CVD apparatus. However, the apparatus according to the present invention further comprises a gas inlet line into the effluent line in proximity to the outlet port of the vacuum pump, a gas heater and a source of gas.

Figure 3:
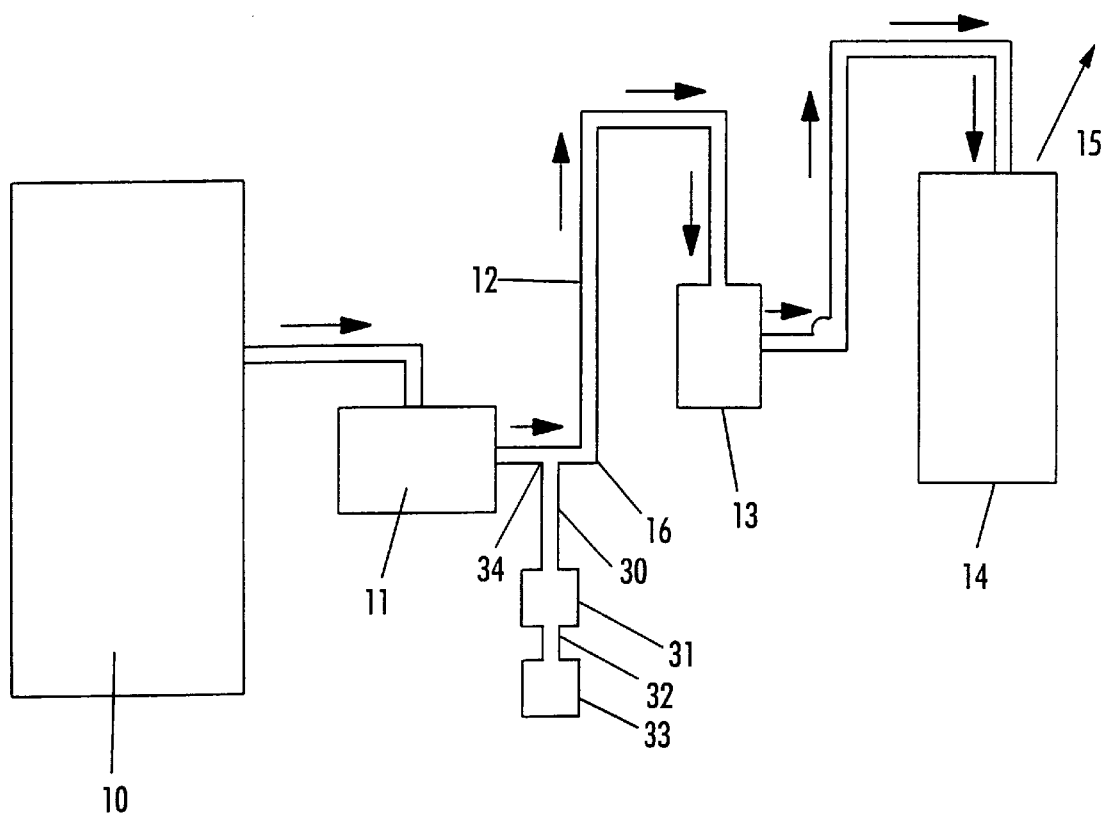
FIG. 3 schematically depicts a CVD system in accordance with the present invention.

An apparatus according to the present invention is schematically depicted in FIG. 3, wherein elements similar to those in the conventional apparatus schematically depicted in FIG. 1 bear similar reference numerals. The apparatus of the present invention further comprises a hot gas inlet line 30 into effluent line 12 in proximity to the outlet port of vacuum pump 11, as at location 34, and a gas heater 31 in communication with hot gas inlet line 30. A source of gas 33 is provided in communication with gas heater 31 through line 32 which may optionally include a control valve (not shown). The source of gas 33 is provided with a gas which, when heated and injected into the effluent line, is capable of maintaining the internal walls of the effluent line at a temperature sufficiently high to prevent condensation of the gaseous species causing the clogging problem, such as $WOF_4$. In an embodiment of the present invention, the gas source comprises a source of dried air, nitrogen or an inert gas, preferably dried air or nitrogen.

In practicing the present invention, a hot gas is injected at a strategic location, such as at location 34 (FIG. 3) downstream of and in proximity to the outlet port of vacuum pump 11, through hot gas inlet line 30. The hot gas is injected into effluent line 12 under conditions sufficient to prevent or substantially reduce clogging by condensation of a condensable gaseous species within effluent line 12, particularly at elbows, such as 90° elbow 16.

Severe effluent line clogging is attributable to the condensation of a by-product gaseous species. In accordance with the present invention, a hot gas is injected at a temperature and rate sufficient to maintain the internal walls of the effluent line at a temperature above that at which the gaseous species condenses. As one having ordinary skill in the art would recognize, in order to prevent condensation of a gaseous species, the partial pressure of the condensable species must be maintained below the vapor pressure of the condensable species. In addition, in accordance with the present invention heat loss can be reduced by providing insulation around the effluent line. This can be accomplished by the application of a conventional insulation tape, such as a foam tape, or electrical heating tape.

The present invention effectively prevents or substantially reduces effluent line clogging in various CVD systems employed for the deposition of various metallic species. In one embodiment of the present invention, effluent line clogging in a W-CVD system is prevented or substantially reduced by injecting a hot gas, such as dried air, nitrogen or an inert gas, into the effluent line under conditions to prevent condensation of $WOF_4$.

With reference to FIG. 1, clogging in effluent line 12 of a W-CVD system, i.e., an apparatus comprising a W-CVD chamber, is believed to be attributable to condensed $WOF_4$ powder which is generated primarily during the cleaning phase. A conventional W-CVD procedure comprises preconditioning chamber 10, W-CVD, cleaning the chamber with a fluorinated species. It is believed that most of the $WOF_4$ deposition and, hence, clogging occurs during the cleaning phase. In accordance with the present invention (FIG. 3), a hot gas is injected into effluent line 12 downstream of and in proximity to the vacuum pump, as at location 34, under conditions, such as temperature and rate of injection, sufficient to prevent condensation of $WOF_4$ on the inside walls of the effluent line. In one aspect of the present invention, the hot gas is injected continuously during processing, particularly during cleaning. However, it is preferred to continuously inject a hot gas even while the apparatus is not utilized for processing, to continuous suitable temperatures.

The hot gas can be any gas which is capable of maintaining the internal walls of the effluent line below the condensation temperature of the condensable gaseous species, such as $WOF_4$, and does not detrimentally affect the apparatus or processing. Dried air, nitrogen and inert gases have been found suitable. In a preferred embodiment of the present invention, the hot gas is dried air or nitrogen, most preferably nitrogen.

In applying the present invention to a W-CVD system, the hot gas is injected at a temperature and rate sufficient to maintain the internal walls of the effluent line below the temperature at which $WOF_4$ condenses. Based upon thermodynamic considerations, it is believed that the internal walls of the effluent line should be maintained at a temperature of at least about 60° C. to about 80° C. in order to prevent condensation of $WOF_6$. Accordingly, for a particular apparatus, depending upon the materials of the system and design configuration, one having ordinary skill in the art could easily determine an appropriate temperature and injection rate of the hot gas to achieve the objective of preventing cooling in the effluent line to maintain the internal walls of the effluent line at a temperature sufficient to prevent condensation and, hence, deposition of $WOF_4$. It has been found that the condensation of $WOF_4$ can be effectively prevented or substantially reduced in an effluent line by injecting the hot gas at a temperature of about 20° C. to about 260° C., preferably 40° C. to about 90° C. It has also been found that the hot gas can be introduced at a rate of about 10 to about 300 standard liter per minute (slpm), such as about 10 to about 100 slpm, preferably about 10 to about 25 slpm.

The present invention also addresses and solves the problem of clogging in a wet scrubber utilized downstream of an effluent line in a conventional CVD system, particularly a W-CVD system. In accordance with another embodiment of the present invention, undesirable $WO_3$ deposition in the wet scrubber, particularly proximate the inlet of a wet scrubber, is removed in an efficient and simplified manner by periodically injecting a hot gas into the effluent line, as at location 34 in FIG. 3, at a high burst rate. When employing a wet scrubber, filter 13 is omitted. In an aspect of this embodiment of the present invention, a hot gas, such as nitrogen, dried air or an inert gas, is injected into the effluent line of a CVD system at a high burst rate, such as about 250 to about 350 slpm, for a few seconds, such as 5 to 25 seconds, periodically. For example, it was found that a very short hot nitrogen flush of about 300 slpm for about 10 seconds, once or twice a week, can easily remove any accumulated film of deposited $WO_3$ in the moisture-rich area of a wet scrubber. This simplified, efficient technique obviates the need for preventive maintenance which requires opening the wet scrubber with an attendant disadvantage in downtime.

The present invention can be practiced by modifying conventional CVD equipment to provide a hot gas inlet line, gas heater and gas source, for the injection of a hot gas to reduce clogging in a CVD system and/or reduced clogging in a wet scrubber. Thus, the present invention has applicability to conventional CVD apparatus, particularly a conventional W-CVD apparatus, such as the Novellus Concept One-Tungsten CVD apparatus, marketed by Novellus Systems in San Jose, Calif., or those commercially marketed by Applied Materials of Santa Clara, Calif.

The scrubber employed in practicing the present invention can be any of those commercially available, such as the Vector ES-Series Fume Scrubber. In carrying out the present invention, any conventional means for heating the gas introduced into the effluent line can be employed. For example, when employing nitrogen, an EXS11550-2 circulation heater manufactured by Colortech, Inc., Glen Burnie, Md., can be employed.

Although, various aspects of the present invention have been described with respect to the deposition of tungsten, the present invention has applicability to any type of CVD systems wherein plugging is encountered in an effluent line due to the condensation of a vapor species and/or plugging in a wet scrubber. In accordance with the present invention, plugging due to the condensation of a vapor species is prevented or substantially reduced by injecting a hot gas, such as dried air, nitrogen or an inert gas, into the effluent line under conditions sufficient to maintain the internal walls of the effluent line at a temperature sufficient to prevent condensation of the vaporous species which causes plugging. In addition, periodic flushes at a high burst also effects removal of clogging in a wet scrubber, particularly in the moisture-rich area due to $WO_3$.

The present invention enjoys applicability with respect to various conventional CVD systems which can be easily modified in a cost-effective manner by providing means for injecting a hot gas into the effluent line. The present invention, therefore, provides a solution to serious plugging problems, particularly plugging problems in the effluent line of a CVD system, in a relatively simplified and expedient manner, thereby avoiding costly delays due to downtime and preventive maintenance, increasing product throughput and product uniformity, and reducing exposure to toxic wastes.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of reducing clogging in an effluent line communicating with a chemical vapor deposition chamber due to condensation of vapors in the effluent line, which method comprises injecting a hot gas from externally of the chemical vapor deposition chamber directly into the effluent line to maintain the temperature of internal walls of the effluent line above the temperature at which condensation of the vapors occurs.

2. The method according to claim 1, wherein
the apparatus comprises a vacuum pump having an inlet port in communication with the chemical vapor deposition chamber and an outlet port in communication with the effluent line; and the method comprises
injecting the hot gas into the effluent line downstream of and in proximity to the outlet port of the vacuum pump.

3. The method according to claim 2, wherein the apparatus further comprises a wet scrubber in communication with the effluent line downstream of the hot gas inlet into the inlet line.

4. The method according to claim 1, wherein the gas is dried air, nitrogen or an inert gas.

5. The method according to claim 1, wherein the gas is dried air or nitrogen.

6. The method according to claim 2, comprising:
chemical vapor depositing tungsten on a substrate in the chamber; and
injecting the hot gas into the effluent line under conditions sufficient to prevent condensation of $WOF_4$ on the internal walls of the effluent line.

7. The method according to claim 6, further comprising: preconditioning the chamber, and cleaning the chamber.

8. The method according to claim 7, comprising
cleaning the chamber with a fluorinated species; and
injecting the hot gas into the effluent line during cleaning.

9. The method according to claim 8, wherein the fluorinated species is $SF_6/O_2$, $NF_3/O_2$, $CF_4/O_2$, $C_2F_6$ or $NF_3$, and the hot gas is dried air or $N_2$.

10. The method according to claim 7, comprising injecting the hot gas into the effluent line during preconditioning, chemical vapor deposition, and cleaning.

11. The method according to claim 6, comprising injecting the hot gas at a temperature sufficient to maintain the internal walls of the effluent line at a temperature of at least about 60° C.–80° C.

12. The method according to claim 6, comprising injecting the hot gas is injected at a temperature of about 20° C. to about 260° C.

13. The method according to claim 12, wherein the temperature is about 40° C. to about 90° C.

14. The method according to claim 6, comprising injecting the hot gas at a rate of about 10 to about 300 slpm.

15. The method according to claim 14, comprising injecting the hot gas at a rate of about 10 to about 100 slpm.

16. The method according to claim 15, comprising injecting the hot gas at a rate of about 10 to about 25 slpm.

17. The method according to claim 6, wherein the apparatus comprises a wet scrubber downstream and in communication with the effluent line, and the method further comprises periodically injecting hot dried air or hot nitrogen at a rate of about 250 to about 350 slpm for about 5 to about 30 seconds to remove deposited tungsten oxide proximate the inlet of the wet scrubber.

18. A method of manufacturing a semiconductor device, which method comprises:
depositing tungsten by chemical vapor deposition on a substrate in a chemical vapor deposition chamber;
exhausting vapors from the chamber by a vacuum pump through an effluent line; and
injecting a hot gas from externally of the chemical vapor deposition chamber directly into the effluent line to substantially reduce clogging in the effluent line due to the condensation of $WOF_4$ by maintaining the internal walls of the effluent line at a temperature above that at which condensation of $WOF_4$ occurs.

19. The method according to claim 18, further comprising: preconditioning the chamber, and cleaning the reaction chamber; and injecting the hot gas during preconditioning, depositing, and cleaning.

20. The method according to claim 19, comprising cleaning the reaction chamber employing a fluorinated species.

21. The method according to claim 20, wherein the fluorinated species is $SF_6/O_2$, $NF_3/O_2$, $CF_4/O_2$, $NF_3$ or $C_2F_6$.

22. The method according to claim 18, wherein the hot gas is air, nitrogen, or an inert gas.

23. The method according to claim 18, wherein the hot gas is dried air or nitrogen.

24. The method according to claim 18, comprising injecting the hot gas into the effluent line at a temperature sufficient to maintain the internal walls of the effluent line at a temperature of at least about 60° C.–80° C.

25. The method according to claim 18, wherein the hot gas is injected at a temperature of about 20° C. to about 260° C.

26. The method according to claim 25, wherein the hot gas is injected at a temperature of about 40° C. to about 90° C.

27. The method according to claim 18, comprising injecting the hot gas at a rate of about 10 to about 300 slpm.

28. The method according to claim 27, comprising injecting the hot gas at a temperature of about 10 to about 100 slpm.

29. The method according to claim 28, comprising injecting the hot gas at a temperature of about 10 to about 25 slpm.

30. The method according to claim 18, wherein: the apparatus further comprises a wet scrubber in communication with the effluent line downstream of the hot gas injection.

31. The method according to claim 30, further comprising periodically introducing hot dried air or hot nitrogen into the effluent line at a rate of about 250 to about 300 slpm for about 5 to about 30 seconds to remove deposited tungsten oxide proximate the inlet of the wet scrubber.

32. A method of reducing tungsten oxide clogging in the moisture-rich area of a wet scrubber situated downstream of and in communication with a tungsten-chemical vapor deposition chamber via an effluent line, which method comprises periodically injecting a hot gas from externally of the tungsten-chemical vapor deposition chamber directly into the effluent line at a rate of about 250 to about 350 slpm for about 5 to about 30 seconds.

33. The method according to claim 32, comprising injecting hot dried air or nitrogen.

34. The method according to claim 1, comprising injecting the hot gas during idle time when the apparatus is not employed for chemical vapor deposition processing.

35. The method according to claim 18, comprising injecting the hot gas during idle time when the apparatus is not employed for chemical vapor deposition processing.

36. The method according to claim 1, further comprising wrapping insulation around the effluent line.

37. The method according to claim 18, further comprising wrapping insulation around the effluent line.

38. The method according to claim 36, wherein the injection of hot dried air or hot nitrogen substantially reduces tungsten oxide clogging in a moisture-rich area of the wet scrubber.

39. The method according to claim 31, wherein the periodic introduction of hot dried air or hot nitrogen substantially reduces tungsten oxide clogging in a moisture-rich area of the wet scrubber.

40. The method according to claim 31, comprising injecting the hot gas into the effluent line during idle time when the apparatus is not employed for chemical vapor deposition processing.

41. The method according to claim 1, wherein the hot gas is injected externally to the chemical vapor deposition chamber.

42. The method according to claim 18, wherein the hot gas is injected externally to the chemical vapor deposition chamber.

43. The method according to claim 32, wherein the hot gas is injected externally to the chemical vapor deposition chamber.

\* \* \* \* \*